United States Patent [19]

Schiffman

[11] 4,101,373
[45] Jul. 18, 1978

[54] METHOD AND APPARATUS FOR PRODUCING A DESIGN ON A FLAT SURFACE ADAPTED TO BE FORMED INTO AN ARCUATE SURFACE

[75] Inventor: Murray M. Schiffman, Westport, Conn.

[73] Assignee: MBI, Inc., Westport, Conn.

[21] Appl. No.: 733,711

[22] Filed: Oct. 18, 1976

[51] Int. Cl.² ...................... G03B 27/32; G03B 21/00
[52] U.S. Cl. ................................ 156/659; 96/36.2; 353/79; 353/121; 355/50; 355/77
[58] Field of Search ............. 96/27, 36.2; 353/79, 353/46, 121; 156/659–661, 345, 58; 355/18, 50, 55, 77

[56] References Cited
U.S. PATENT DOCUMENTS

| 3,155,505 | 11/1964 | Shannon | 96/38.4 |
| 3,573,045 | 3/1971 | Lemelson | 156/58 X |
| 3,732,134 | 3/1973 | Michael | 156/58 |

*Primary Examiner*—William A. Powell
*Attorney, Agent, or Firm*—Cooper, Dunham, Clark, Griffin & Moran

[57] ABSTRACT

Method and apparatus for producing a design on a flat surface by etching and/or selective plating. The design is transferred to the flat surface by progressively projecting successive narrow transverse images of the design from a rectangular transparency and progressively rotating the flat surface about an axis such that the narrow images of the design are successively projected upon and received by corresponding radial portions of the flat surface which is or has been photosensitized. The design appears on the flat surface in a foreshortened circular form. The flat surface is adapted for subsequent formation into an arcuate surface bearing the design in relatively undistorted form.

14 Claims, 4 Drawing Figures

METHOD AND APPARATUS FOR PRODUCING A DESIGN ON A FLAT SURFACE ADAPTED TO BE FORMED INTO AN ARCUATE SURFACE

BACKGROUND OF THE INVENTION

The present invention relates to the production of a design on an arcuate or irregular surface. More particularly, the invention relates to method and apparatus for transferring a flat rectangular design onto a flat surface in a foreshortened circular form for subsequent formation into an arcuate surface bearing such design in relatively undistorted form.

Multi-colored metal designs have been produced on flat surfaces using conventional photographic masking techniques to allow successive selective etching and/or metal deposition corresponding to each color effected, as in U.S. Pat. No. 2,731,333 to Ko. Such surfaces can then be curved or pressed into a desired shape, such as in U.S. Pat. No. 3,503,815 to Johnson. However, this procedure is limited by the extent to which an arcuate surface can be formed without excessive distortion of the design, which would usually be in a flat rectangular-coordinate form.

It is also known to this applicant to transfer a flat design directly to an arcuate surface by use of a projection and rotation technique, as in applicant's co-pending patent application, Ser. No. 729,764, filed Oct. 5, 1976, entitled "Method and Apparatus for Producing a Design on an Arcuate Surface." In that method, subsequent processing takes place on the preformed surface. Accordingly, additional hand labor and equipment are necessary if a manufacturer has been equipped to further process only flat surfaces.

SUMMARY OF THE INVENTION

It is a primary object of this invention to provide a method of reproducing a flat rectangular-coordinate design on an arcuate surface with minimum distortion. It is another object of the invention to provide a method of transferring a design from a flat rectangular-coordinate form to a flat polar-coordinate form. It is still another object of this invention to provide a useful means for producing an etched and/or multi-finished foreshortened circular design in a readily repeatable manner as for a production run on each of many flat pieces for subsequent formation into arcuate shapes. A further object is to provide apparatus for readily producing designs conforming to differently shaped surfaces and/or in different proportions, as for a set, or prototypes, or custom or sample items. It is a further object to provide a method for the successive application of a resist-coat on a flat surface corresponding to the finish-separated patterns of a multi-finished design so as to allow successive corresponding etching and/or superimposition of different metals or other coatings by conventional means to reproduce such a design on such surface for subsequent formation into an arcuate surface bearing such design without apparent distortion.

The method of the present invention provides a means to generate circular design patterns in foreshortened form either on a set of registerable masks or directly onto a formable flat surface. This is achieved by projection of successive transverse portions of the design pattern onto corresponding radial portions or segments of the mask or surface as they are moved and rotated in synchronization with one another. The flat surface is then formed into an arcuate shape bearing the design in relatively undistorted form.

In the apparatus of the invention, a design in a flat rectangular form, i.e. rectangular-coordinate form, is created upon a narrow transparency. Narrow transverse images from the transparency are progressively and successively projected toward a flat, substantially circular mask or formable surface, which has or is provided with a photosensitive coating. The mask or surface is progressively rotated about an axis, which is maintained perpendicular to the projected narrow areas and parallel to the axis of light projection. The image surface rotation is synchronized with the progressive projection of the narrow images such that the narrow images are successively projected upon and received by the flat surface in foreshortened circular form, i.e. polar-coordinate form. After exposure, the coating is fixed and the unexposed portion dissolved. The latter area of the surface is then etched, plated or otherwise processed. Finally, the flat surface is formed into the arcuate shape.

If the image surface is itself a mask, it can be used for repetitive transference of the polar-coordinate design onto other flat surfaces.

DETAILED DESCRIPTION

Generally, photoetching or selective photoplating of a surface is accomplished by applying a photoresist coating to the surface to be processed and then light-exposing that portion not to be etched or plated through a corresponding transparency or mask held in close contact to the surface. The light-exposed resist is then fixed and the unexposed resist is dissolved. When the surface is immersed in an etching or plating solution, processing will take effect selectively only where the resist has been removed, thus producing a desired pattern. This process is readily accomplished where the surface to be processed is flat and close contact with a flat transparency or mask can be established. However, in the case of a non-cylindrical arcuate surface, it is difficult to conform the desired design image to any extensive area of the arcuate surface by the above-described conventional techniques.

Conformance of the design image from a conventional flat transparency or mask to an arcuate surface is accomplished in accordance with the present invention by projecting successive narrow transverse images from the transparency or mask in a foreshortened form upon corresponding successive narrow radial segments of a photoresist-coated flat surface which is simultaneously and synchronously rotated. Successive processing will produce a circularly patterned flat surface in slightly distorted form and suitable for forming into a desired arcuate surface bearing the design without apparent distortion.

Figure 1:
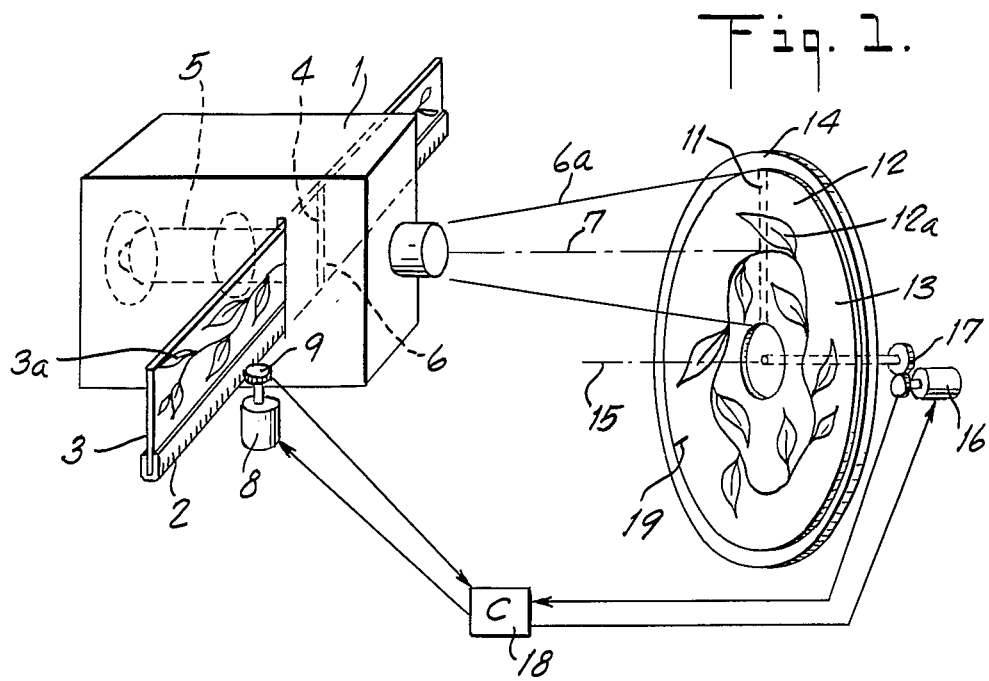
FIG. 1 is a perspective view of apparatus for synchronously projecting successive transverse portions of a design pattern onto a rotating flat image surface in accordance with the invention.
Figure 2:
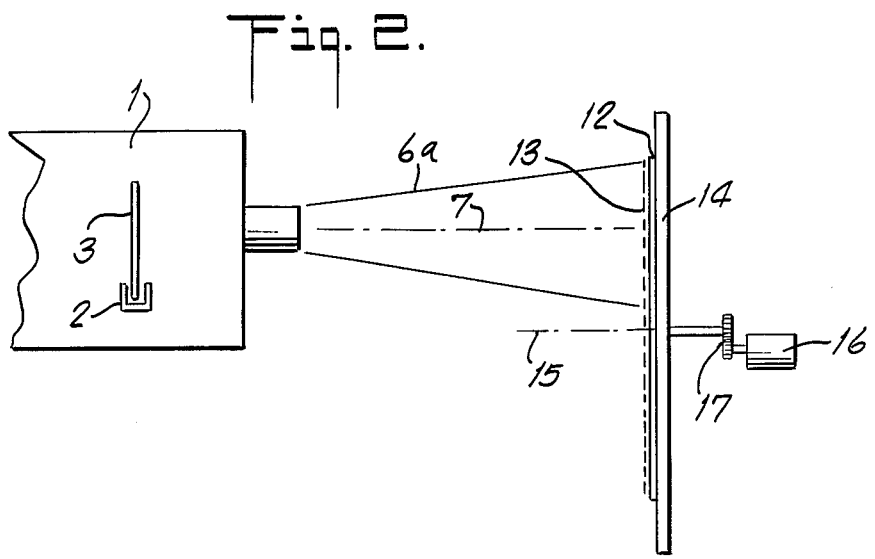
FIG. 2 is an elevational view of the apparatus for synchronously projecting successive transverse portions of a design pattern onto a rotating flat image surface.

Referring to FIGS. 1 and 2 of the drawings, a projector 1 of a conventional type is provided with a movable carrier 2 which is adapted to hold a flat, rectangular transparency or mask 3 having a design pattern 3a thereon. A narrow opening or slit 4 is provided in the path of a projection light 5. This narrow opening 4 is about ⅛ in. wide, although other size openings may be suitable. A motor 8 progressively drives the carrier 2 across the path of the light 5 by means of a gear train 9. Narrow transverse areas 6 of the transparency 3 are progressively and successively moved into the path of the light 5, when registered with the narrow opening 4. Light and dark narrow images 6a corresponding to the pattern at the respective narrow transverse areas 6 of the transparency 3 are thereupon successively projected in the direction of the light beam axis 7. As used herein, the term "narrow transverse area" means each successive portion of the transparency which is exposed to the light source at the narrow slit 4, similarly to the well-known projection technique of slides or photographic transparencies.

The projected narrow images 6a are displayed upon and received by corresponding narrow radial areas or segments 11 of a flat, substantially circular surface 12 suitable for forming into an arcuate surface, e.g. a bell. The flat circular surface 12 is provided with a photoresist coating 13. Portions of the coating 13 are thereby exposed to the projected images. After the entire flat, circular surface has been progressively and successively exposed at the narrow radial areas 11, an entire design pattern 12a is created on the flat circular surface 12 corresponding to the flat rectangular pattern 3a on the transparency or mask 3. However, the rectangular-coordinate design pattern 3a on the transparency 3 has been converted to a foreshortened, polar-coordinate design pattern 12a on the circular flat surface 12. The term "foreshortened," as used herein, means that the design pattern 12a is smaller in size than the design pattern 3a because the design pattern 12a is stretched when the flat surface 12 is formed into arcuate shape. The amount of foreshortening is determined empirically and depends upon the arcuate shape to be produced. For example, a cup requires a substantial amount of foreshortening; a shallow dish requires very little. If some distortion is desired in the final shape, it may be possible to eliminate the foreshortening.

The flat, circular surface 12 is held up on a rotatable table 14 having a rotation axis 15. This axis 15 is parallel to the light beam axis 7 and perpendicular to the transparency 3 and surface 12. The distance of the surface 12 from the transparency 3 is adjustable to provide the required amount of foreshortening. The table 14 is rotatable by a motor 16, either directly or through a gear train 17. Rotation of the table 14 is synchronized with the linear motion of the carrier 2 for proper positioning and exposure time of the successive narrow areas 11. Synchronization can be accomplished by providing carrier speed sensing means and table speed sensing means at the respective gears 9 and 17.

A controller 18 of any conventional type adjustably controls the individual and relative speeds of the carrier motor 8 and the table motor 16. The relative speeds of the carrier 2 and the table 14 depend upon the relative sizes of the transparency and flat, circular surface. If there is a 1:1 size relation, the peripheral movement of the flat, circular surface should equal the linear movement of the carrier and transparency. Successive patterns may be registered by an index mark 19 and conventional start and stop controls (not shown).

To transfer a design for subsequent etching and/or plating, the projector 1 is positioned relative to and focused upon the flat, circular surface 12 for desired image size and amount of foreshortening. The photoresist-coated flat, circular surface 12 is centered on the table 14 and positioned relative to the table index mark 19. A first transparency or mask 3 is positioned on the carrier 2. Synchronized motion of the carrier 2 and the table 14 is initiated and continued through a complete exposure of successive narrow transverse images 6a of the pattern on the photoresist-coated surface 12. The flat, circular surface 12 is removed and processed for etching or plating in the conventional manner, for example, as in U.S. Pat. No. 3,503,815 to Johnson. To process a successive pattern, a new coating of photoresist 13 is applied to the flat, circular surface 12 and the above described cycle is repeated. A desired etched and/or multi-finished design is thereby produced on the flat, circular surface 12.

The flat, circular surface 12 may itself be a mask, stencil or transparency. This mask or masks may then be used in mass producing a series of flat, circular surfaces suitable for forming into the desired arcuate articles. Also, the flat surface 12 need not be circular, although that configuration is useful for creating certain arcuate shapes, e.g. a bell.

Figure 4:
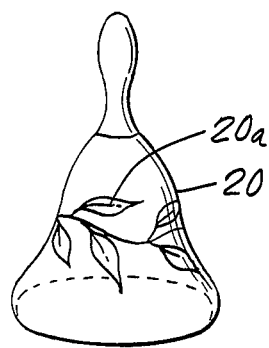
FIG. 4 is a perspective view of an arcuate surface formed in accordance with the method of the invention.
Figure 3:
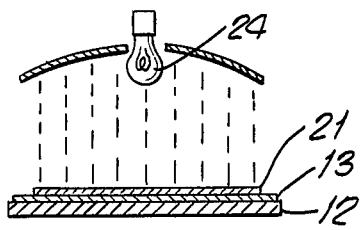
FIG. 3 is a sectional elevational view of apparatus for exposing a photosensitized flat surface to circular patterned masks useful in the method of the invention.

For preparing a large number (or more than several) of the same shaped surfaces with the same designs, an expeditious mass production method desirably is employed. This modification permits the use of a simple light source and the simultaneous exposure of all areas of a flat, circular surface once the mask has been formed. As shown in FIG. 3, a flat, circular transparency or mask 21 is produced by the method shown in FIGS. 1 and 2. This mask 21 is placed over a matching flat surface 12 onto which a photosensitized coating 13 has been deposited. The transparency or mask 21 and the surface 12 are then exposed to a light source 24 and developed and fixed by conventional photographic means to produce an image on the surface. Transparency or mask sets may be used to produce successive, registered, circular design patterns on the flat, formable surface. The flat, circular surface is processed in the conventional manner by successively photoresist-coating, contact exposing, fixing or developing, and etching or plating as required. It is thereafter formed, as in FIG. 4, into the desired arcuate shape 20 bearing the desired design 20a without apparent distortion.

Masks produced in this way may also be etched through to form stencils for use in coating the arcuate surface. After positioning a stencil 21 on the arcuate surface 12, either a final or a resist coating 13 is applied by spray, brush or other deposition means. As a resist coat, subsequent processing for etching and/or plating would be carried out in the conventional manner.

The above descriptions are intended to be illustrative of methods for conforming a flat, rectangular-coordinate design pattern to a corresponding polar-coordinate flat, circular design pattern suitable for formation into a desired arcuate surface bearing the design in proper proportion without apparent distortion. The present invention has substantial use in the production of bowls, bells, jewelry and other decorated items having an arcuate or other irregular surface. The word "arcuate," as used herein, is intended to mean irregular, non-flat surfaces of various sizes and shapes. Many other uses of the invention will be apparent to those working in this and related fields.

I claim:

1. A method of transferring a design from a flat rectangular-coordinate form to a flat polar-coordinate form, comprising progressively projecting successive narrow transverse images of the design from a flat rectangular transparency and progressively rotating a flat surface spaced from the transparency about an axis such that the narrow transverse images of the design are successively projected upon and received in polar-coordinate form by narrow radial segments of the flat surface maintained substantially perpendicular to the direction of projection.

2. A method according to claim 1 wherein the flat surface is progressively rotated in synchronization with the progressive projection of the narrow transverse images.

3. A method according to claim 1 wherein the flat surface is a mask which receives the projected narrow transverse images of the design.

4. A method according to claim 1 wherein the flat surface is a stencil which receives the projected narrow transverse images of the design.

5. A method according to claim 1 wherein the flat surface is a transparency which receives the projected narrow transverse images of the design.

6. A method according to claim 1 further comprising forming the flat surface into an arcuate form bearing the design in relatively undistorted form.

7. A method of producing a polar-coordinate design on a flat image surface from a rectangular-coordinate design, comprising:
    (a) forming the design in rectangular-coordinate form upon a relatively flat transparency;
    (b) progressively and sequentially exposing narrow transverse areas of the transparency to a directional light source whereby images of the design are progressively and sequentially projected in the direction of the light;
    (c) providing the flat image surface with a photosensitive coating;
    (d) disposing the flat image surface spaced from the transparency such that narrow radial segments thereof are progressively and sequentially maintained substantially perpendicular to the direction of the light and substantially parallel with the projected images;
    (e) rotating the flat image surface about an axis in synchronization with the progressive projection of the transparency such that the projected narrow transverse images of the design are progressively and sequentially received by said narrow radial segments of the flat image surface and the design in polar-coordinate form is exposed upon the photosensitive coating of the image surface; and
    (f) processing the exposed coating on the flat image surface to selectively produce the design upon the surface.

8. A method according to claim 7 further comprising repeating each of the steps thereof to produce a second design upon the image surface.

9. A method according to claim 7 further comprising forming said flat image surface into an arcuate surface bearing the design restored to a rectangular-coordinate disposition in arcuate form.

10. A method according to claim 7 further comprising:
    (g) applying the flat image surface bearing the polar-coordinate design to a flat base of substantially the same dimensions;
    (h) providing the flat base with a photosensitive coating;
    (i) exposing the flat image surface and the flat base to a light source to transfer the design from the flat image surface to the flat base; and
    (j) processing the exposed coating on the flat base to produce the design thereon.

11. A method according to claim 10 further comprising forming said flat base into an arcuate surface bearing the design restored to a rectangular-coordinate disposition in arcuate form.

12. Apparatus for transferring a design from a flat rectangular-coordinate form to a flat polar-coordinate form, comprising projection means for progressively projecting successive narrow transverse images of the design from the rectangular-coordinate form and support means adapted to hold a flat image surface spaced from the transparency and substantially perpendicular to the direction of projection and to progressively rotate the surface about an axis such that the narrow transverse images of the design are successively projected upon and received in polar-coordinate form by narrow radial segments of the flat image surface.

13. Apparatus according to claim 12 further comprising means for synchronizing the rate of progressive projection of the successive narrow transverse images of the design from the flat rectangular-coordinate form with the rate of progressive rotation of the flat image surface about the axis.

14. Apparatus for producing a circularly disposed design on a flat image surface, comprising:
    (a) means for projecting a relatively flat transparency upon which the design is in a rectangularly disposed form, including
        (i) a light source,
        (ii) means defining an opening for confining the light in a single narrow path,
        (iii) a carrier for holding the transparency, and
        (iv) means for moving the carrier along a path perpendicular to the narrow light path such that narrow transverse areas of the transparency are registered with the opening and are progressively and sequentially exposed to the light source, whereby narrow transverse images from the design are progressively and sequentially projected in the direction of the light path;
    (b) means for holding the flat image surface spaced from the transparency such that narrow radial segments thereof are progressively and sequentially maintained substantially perpendicular to the light path and substantially parallel with the projected images; and
    (c) means for rotating the flat image surface about its axis in synchronization with the motion of the carrier such that the projected images from the design are progressively and sequentially received by said narrow radial segments of the flat image surface and are transferred thereto to produce a substantially circular design image.

* * * * *